United States Patent
Dudeck et al.

(10) Patent No.: US 7,085,149 B2
(45) Date of Patent: Aug. 1, 2006

(54) METHOD AND APPARATUS FOR REDUCING LEAKAGE CURRENT IN A READ ONLY MEMORY DEVICE USING TRANSISTOR BIAS

(75) Inventors: Dennis E. Dudeck, Hazelton, PA (US); Donald Albert Evans, Lancaster, OH (US); Ross Alan Kohler, Allentown, PA (US); Richard Joseph McPartland, Nazareth, PA (US); Hai Quang Pham, Hatfield, PA (US)

(73) Assignee: Agere Systems Inc., Allentown, PA (US)

( * ) Notice: Subject to any disclaimer, the term of this patent is extended or adjusted under 35 U.S.C. 154(b) by 137 days.

(21) Appl. No.: 10/764,000

(22) Filed: Jan. 23, 2004

(65) Prior Publication Data

US 2005/0162941 A1    Jul. 28, 2005

(51) Int. Cl.
*G11C 17/08*    (2006.01)

(52) U.S. Cl. .......................... 365/104; 365/94; 365/203

(58) Field of Classification Search .................. None
See application file for complete search history.

(56) References Cited

U.S. PATENT DOCUMENTS

| | | | |
|---|---|---|---|
| 5,434,822 A * | 7/1995 | Deleganes et al. ........... | 365/203 |
| 5,635,417 A * | 6/1997 | Natsume ..................... | 438/130 |
| 5,790,466 A * | 8/1998 | Hotta ......................... | 365/203 |
| 5,909,403 A * | 6/1999 | Fujitaka ..................... | 365/189.09 |
| 6,420,765 B1 * | 7/2002 | Zambrano ................... | 257/391 |
| 6,459,615 B1 | 10/2002 | McPartland et al. ..... | 365/185.1 |
| 6,512,700 B1 | 1/2003 | McPartland et al. .... | 365/185.28 |

* cited by examiner

*Primary Examiner*—Son Mai

(57) ABSTRACT

A method and apparatus are provided for reducing leakage current in a read only memory device. Leakage current is reduced by applying a biased gate voltage (relative to a source voltage) to the gate of at least one of transistor in the array. The biased gate voltage is applied at least during a precharge phase of a read cycle. When the array transistors are n-channel transistors, the biased voltage is a negative bias voltage (relative to the source voltage). When the array transistors are p-channel transistors, the biased voltage is a positive bias voltage (relative to the source voltage). Applying a negative backgate bias to the transistor's p-well contact can also reduce n-channel transistor subthreshold leakage current. Thus, for an n-channel array, a negative gate voltage and backgate bias (optional) are applied to cell transistors in the off state. Similarly, the subthreshold leakage current of p-channel transistors is reduced by applying a more positive gate-to-source bias and a positive n-well-to-source bias.

30 Claims, 3 Drawing Sheets

METHOD AND APPARATUS FOR REDUCING LEAKAGE CURRENT IN A READ ONLY MEMORY DEVICE USING TRANSISTOR BIAS

CROSS-REFERENCE TO RELATED APPLICATIONS

The present application is related to U.S. patent application Ser. No. 10/764,150, entitled "Method and Apparatus for Reducing Leakage Current in a Read Only Memory Device Using Shortened Precharge Phase," and U.S. patent application Ser. No. 10/764,152, entitled "Method and Apparatus for Reducing Leakage Current in a Read Only Memory Device Using Pre-Charged Sub-Arrays," each filed contemporaneously herewith and incorporated by reference herein.

FIELD OF THE INVENTION

The present invention relates generally to electronic memory devices, and more particularly to the reduction of leakage current in electronic memory devices comprised of arrays of transistors.

BACKGROUND OF THE INVENTION

Data storage devices, such as read only memories ("ROMs"), typically store data in arrays of memory cells. Generally, a memory cell consists of a single transistor for each bit to be stored. The memory array is typically permanently programmed during the fabrication process. Thus, ROM memory devices are generally used to store data or code that will not be altered after the ROM memory device is manufactured. Non-volatile ROM memory devices, such as electrically erasable programmable ROMs (EEPROMs), are capable of maintaining stored information even in the absence of power.

ROM memory devices are often fabricated, for example, using Complementary Metal Oxide Semiconductor (CMOS) semiconductor fabrication technologies. As the size of ROM memory devices decrease, with improvements in integrated circuit fabrication technologies, the more narrow trace widths and shorter channel lengths of the ROM memory cell transistors can cause high leakage currents, referred to as transistor sub-threshold leakage current. In previous CMOS technologies, where trace widths were on the order 0.16 micrometers (μm) or more, transistor sub-threshold leakage current was much lower, even for relatively short channel length and narrow width devices. ROM memories fabricated using these prior CMOS technologies typically did not suffer from significant leakage problems.

With more advanced CMOS technologies having trace widths of 0.16 μm or less, however, the transistor sub-threshold leakage current becomes a significant problem. A number of techniques have been proposed or suggested for reducing transistor sub-threshold leakage current in CMOS transistors, including the use of relatively long channel length or relatively wider channel width cell transistors (or both). Such techniques, however, cause an undesirable increase in the physical size of the memory device, reduce the maximum frequency of operation and increase the active and standby currents. A need therefore exists for improved techniques for reducing leakage current in ROM devices.

SUMMARY OF THE INVENTION

Generally, a method and apparatus are provided for reducing leakage current in a read only memory device. The present invention reduces leakage current in a read only memory array by applying a biased gate voltage (relative to a source voltage) to the gate of at least one of transistor in the array. The biased gate voltage is applied at least during a precharge phase of a read cycle. When the array transistors are n-channel transistors, the biased voltage is a negative bias voltage (relative to the source voltage). When the array transistors are p-channel transistors, the biased voltage is a positive bias voltage (relative to the source voltage).

In an exemplary implementation of the invention employing n-channel transistors, the reduced off-state gate voltage (below the source voltage) reduces n-channel transistor subthreshold leakage current. Applying a negative backgate bias to the transistor's p-well contact can also reduce n-channel transistor subthreshold leakage current. Thus, for an n-channel array, a negative gate voltage and backgate bias (optional) are applied to cell transistors in the off state by raising the source of programmed cell transistors from typically 0 volts (ground) to a small positive potential (typically 0.1 volts). Similarly, the subthreshold leakage current of p-channel transistors is reduced by applying a more positive gate-to-source bias and a positive n-well-to-source bias.

A more complete understanding of the present invention, as well as further features and advantages of the present invention, will be obtained by reference to the following detailed description and drawings.

DETAILED DESCRIPTION

Figure 1:
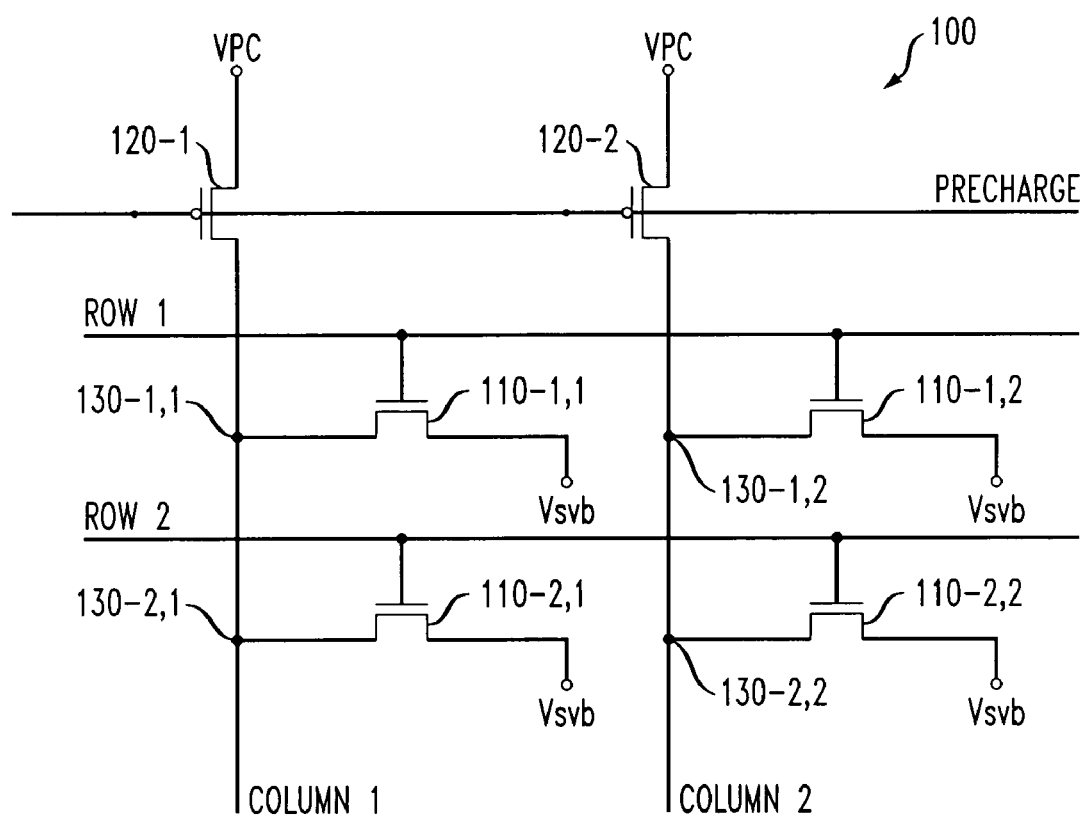
FIG. 1 illustrates a conventional two by two n-channel ROM array of memory cells, where each memory cell is a single n-channel transistor.

FIG. 1 illustrates a conventional two by two ROM array 100 of memory cells 110-1,1 through 110-$i, j$. The memory cells 110-1,1 through 110-$i, j$ are generally comprised of transistors generally arranged in a grid pattern having a plurality (or series) of rows and columns. As shown in FIG. 1, the exemplary ROM array 100 includes a plurality, i, of rows (i=2), and a plurality, j, of columns (j=2). Each memory cell 110 has an associated programmable contact window 130-$i,j$ that may optionally be programmed during the fabrication process.

Each column is supplied with power (VPC) at a first predetermined voltage level, often referred to as the "precharged voltage level," and each row is supplied with power at a second predetermined voltage level. Values for these first and second predetermined voltage levels typically depend upon the selected ROM implementation. For example, when the transistors 110 of the array 100 are n-channel, the column is typically pre-charged to a first predetermined voltage level substantially equal to the power supply voltage ("$V_{DD}$") or another selected pre-charged positive voltage level, while the second predetermined voltage level is typically ground or zero volts ("Vss"). When the transistors 110 of the array 100 are p-channel, the column is typically pre-charged to the first predetermined voltage level substantially equal to a ground potential, zero volts ("Vss") or another selected pre-charged voltage level below $V_{DD}$, while the second predetermined voltage level is substantially equal to the power supply voltage $V_{DD}$.

A gate of each transistor 110 of a ROM array 100 is connected to a particular row of the series of rows. A source of each transistor is generally connected to the source voltage bus, and a drain of each transistor is or is not connected to a particular column of the series of columns, depending upon how the cell 110 is to be programmed. The ROM array 100 is programmed during fabrication by the presence or absence of such a drain-to-column connection (a drain-to-column "contact window"). As indicated above, each column of the series of columns is typically pre-charged to a first predetermined voltage potential referred to as the "pre-charged voltage level", VPC. This voltage level is different than that of the source voltage bus, Vsvb. VPC is typically $V_{DD}$ for an n-channel array and Vss for a p-channel array. The voltage of the source voltage bus, Vsvb, for an n-channel array is typically 0 volts ("Vss"). The voltage of the source voltage bus, Vsvb, for a p-channel array is typically the power supply voltage, $V_{DD}$. The column residing at the pre-charge voltage represents a first logical state such referred to as a "1" data state or a first data state, and is subject to operation of its associated transistor(s).

The memory cells of a ROM array are typically preprogrammed via the presence or absence of a contact window between their transistor drains and their corresponding columns, while all sources are coupled to the source voltage bus. All columns are pre-charged to the pre-charged voltage level VPC using precharge transistors 120. When a "1" data state is desired for a particular bit stored on a particular transistor, no contact is made between that transistor drain and its corresponding column (i.e., absence of the contact window). As a consequence, the column continues to maintain its pre-charged voltage when a row connected to that transistor gate (i.e., a corresponding row) is activated, given the absence of a drain contact to the column. In contrast, when a second logical state referred to as a "0" data state or a second data state is desired for the particular bit stored on a particular transistor, given that its drain is coupled to its corresponding column via the contact window, when the row connected to that transistor gate (i.e., a corresponding row) is activated and the transistor conducts, that column voltage is moved or pulled to the potential of the source voltage bus. That column, therefore, does not maintain its pre-charged voltage level associated with the logical high or first data state, but now represents a logical low or second data state.

To obtain information from a ROM, by a "Read" operation, a row is activated. All transistors along that row are activated via their respective gates. Along the activated row, all of the transistors that have been programmed to a "0" data state move their respective columns towards Vsvb potential. All transistors that have been programmed to a "1" data state will not change the voltage of their associated columns. Their column voltages remain at VPC. The different voltage levels, VPC and Vsvb, are sensed from selected columns, such as for a byte or word of information, using sense amplifiers. Even though all of the columns along a row are activated, only some of the columns are "selected" for output; that is, their data represented by their corresponding voltage levels are forwarded to the output of the memory. The selected columns are typically arranged in a periodic order throughout the population of columns (e.g., reading from every eighth column). A particular data word is selected through appropriately addressing a selected row and selected columns.

Leakage Current in ROM Devices

A read memory cycle in conventional ROM devices 100 includes an evaluation phase followed by a precharge phase. The high leakage currents in CMOS technologies are encountered during the precharge portion of the memory cycle. During precharge, the columns of the memory array are typically charged to a predetermined voltage (such as $V_{DD}$), for example, by supplying current to each column through an associated precharge transistor. For the remainder of the precharge phase, the precharge transistors will supply current to counteract any current leakage from the columns in order to maintain their voltage at the precharged level. The predominant leakage path can be subthreshold leakage through all "programmed" cell transistors connected to all of the columns. During the precharge phase, these cell transistors have their gates biased to keep the transistors in the off state. However, given the high subthreshold leakage current in state-of-the-art CMOS technologies and the large numbers of cell transistors attached to a typical column (128 to 1024), total subthreshold column leakage current can be significant. Furthermore, memory arrays typically have many columns (64 to 1024) so that the memory array subthreshold leakage current due to all the cell transistors attached to all the columns can be excessive. This leakage current is also present during standby periods where the memory is idle, i.e., not being read, but keep precharged so it is available for reading.

According to one aspect of the present invention, leakage current in ROM devices is reduced by up to four orders of magnitude while only minimally degrading read access and read cycle times. The present invention takes advantage of the relationship between transistor bias and transistor subthreshold leakage current to reduce the leakage current in ROM cells and arrays. Effectively, for an n-channel array, the invention applies a negative gate voltage and backgate bias to cell transistors in the off state. This is accomplished by raising the source of programmed cell transistors from typically 0 volts (ground) to a small positive potential, typically 0.1 volts. This reduces cell transistor subthreshold leakage current by typically at least a factor of ten while reducing transistor on-state saturation current typically by less than 15%.

Optionally, the source voltage can be switched between the raised precharge source potential, maintained during precharge, and 0 volts, maintained during the evaluation phase. This reduces the subthreshold leakage current while maintaining the full on-state saturation current. If the voltage is switched, only a group of cells including those cells being read, need to be switched to 0 volts during the evaluation phase.

Optionally, the backgate bias can remain equal to the gate off-state voltage. Also, the raised source voltage can be a function of array leakage current. Using any of these options, the result is a substantial reduction in ROM memory leakage, or standby, current while only a minimal or no reduction in access and cycle times.

ROM Read Cycles

Figure 2:
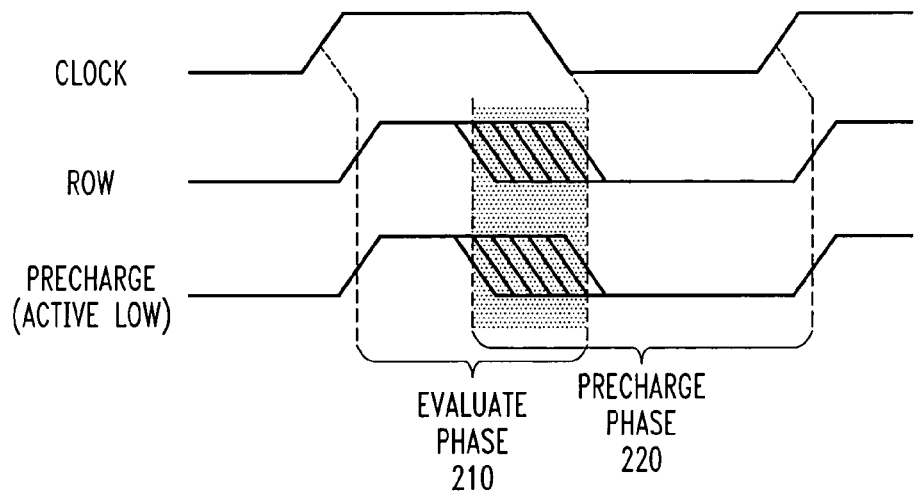
FIG. 2 illustrates the relative timing for the clock, row and precharge signals for a conventional read operation in a ROM device, such as the ROM device of FIG. 1.

As previously indicated, a ROM memory read cycle may be divided into two phases, the evaluation phase and the precharge phase. FIG. 2 illustrates the relative timing for the clock, row and precharge signals for a conventional read operation in a ROM device, such as the ROM device 100. As shown in FIG. 2, in a conventional ROM memory read cycle, the evaluation phase 210 is followed by the precharge phase 220. During a conventional read cycle, before a read cycle begins, all columns in a ROM array have been precharged, at the end of the prior cycle, to a predetermined voltage (typically $V_{DD}$ for an n-channel array). At the beginning of a read cycle, during the evaluation phase, a single row is then activated, turning on all ROM cell transistors along that row (one cell transistor per column). Those cell transistors 110 that are "programmed" will conduct current from the column to the source voltage bus (typically ground for an n-channel array), changing the column voltage towards the source voltage bus potential (ground). Those cells 110 that are not programmed cannot conduct current from the column to ground because their source is unconnected. The columns associated with these cells 110 remain substantially at the precharge voltage level.

As indicated above, subthreshold leakage current of programmed memory cell transistors 110 can drain charge from the columns to the source voltage bus (ground for an n-channel array) during the precharge phase and after the columns have reached their precharged voltage (typically $V_{DD}$ for an n-channel array). This charge must be replenished from the precharge power supply ($V_{DD}$) in order to maintain the required column precharge voltage. With conventional ROM read cycles, the precharge phase 220 is typically one half or more of the cycle time. If the end of the evaluation phase 210 is defined by a clock edge, the precharge phase 220 is one-half cycle in duration. If the evaluation phase 210 is internally timed out, a common technique, the precharge phase 220 will be greater than one-half cycle in duration. In this case, subthreshold leakage current during precharge occurs for a longer portion of the clock cycle.

ROM Memory Cell Transistor Biasing

ROM memory arrays typically use n-channel cell transistors. When p-channel transistors are used, the column precharge voltage would typically be 0 volts (ground) and the source terminals of the p-channel transistors, connected to ths source voltage bus, would typically be connected to $V_{DD}$. With conventional techniques, programmed, off-state (non-conductive state) memory cell transistors are biased with their source voltage (Vs) having the same voltage as their gate voltage (Vg). For n-channel transistors, Vs and Vg are at ground (0 volts); for P-channel transistors, Vs and Vg are at $V_{DD}$. While there might be some cases where the memory array does not operate at ground or $V_{DD}$ levels, but at some other voltages, it would still be true that for an off-state transistor Vs equals Vg.

Programmed memory cells, in the on-state (conductive state,) have their drain voltage (Vd) equal to their gate voltage (Vg). For n-channel transistors, Vd and Vg are at $V_{DD}$; for p-channel transistors, Vd and Vg are at ground (0 volts). While there might be some cases where the memory array does not operate at ground or $V_{DD}$ levels, but at some other voltages, it would still be true that for an on-state transistor Vd equals Vg.

Cell backgate bias voltage is typically equal to 0 volts for transistors in an n-channel array and $V_{DD}$ for transistors in a p-channel array. It is known in the art that applying a negative backage bias (negative backgate (or well contact) to source voltage) to n-channel transistors lowers its sub-threshold leakage current. Likewise, it is known in the art that applying an above $V_{DD}$ backgate bias (positive backgate to source voltage) to p-channel transistors reduces sub-threshold leakage current. In modern CMOS technologies, this is less effective than it was for earlier technologies.

The present invention recognizes that lowering the off-state gate voltage below the source voltage can reduce n-channel transistor subthreshold leakage current. Applying a negative backgate bias to the transistor's p-well contact can also reduce n-channel transistor subthreshold leakage current. P-channel transistors have similar subthreshold leakage current biasing characteristics with leakage current reduced by applying a more positive gate to source bias and a positive n-well to source bias.

Reducing Off-State Gate Leakage Current

The present invention biases off-state ROM cell transistors to substantially reduce their subthreshold leakage current. Effectively, for off-state n-channel cell transistors, the gate is biased negative with respect to the source and their p-well may also (but not necessarily) be biased negative with respect to the source. Off-state p-channel cell transistors would have their gate biased positive with respect to their source with their n-well optionally biased positive with respect to their source.

Figure 3:
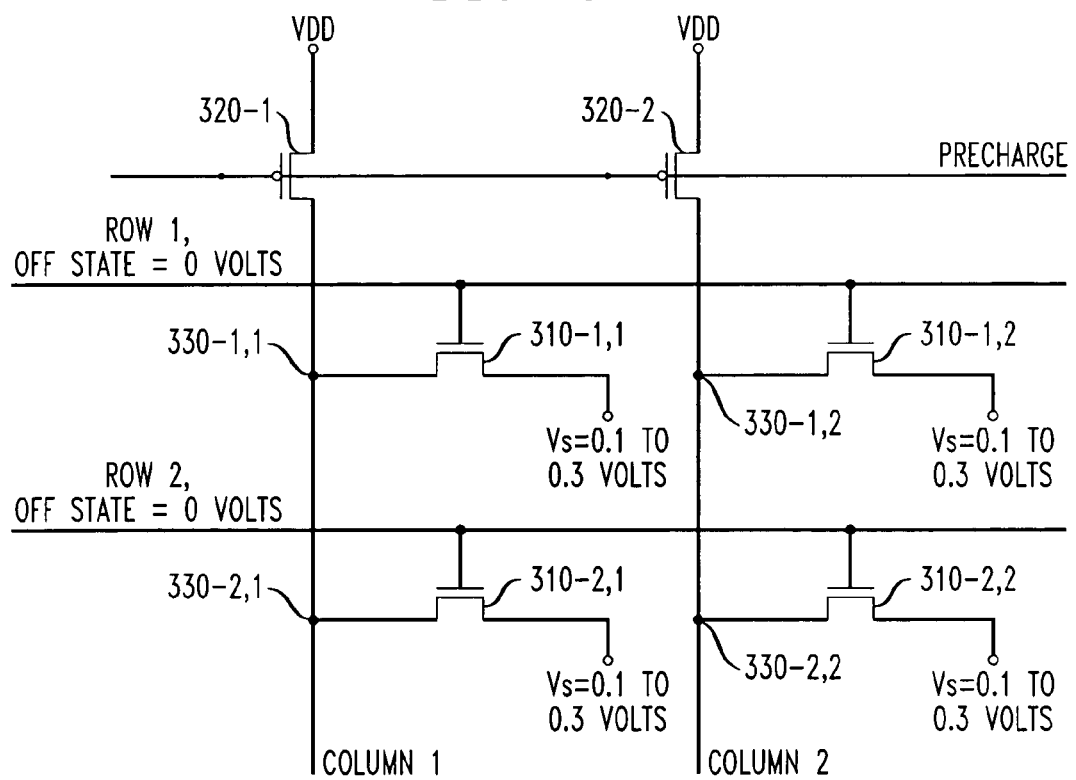
FIG. 3 illustrates an exemplary n-channel ROM array incorporating features of the present invention.

FIG. 3 illustrates an exemplary two by two ROM array 300 of memory cells 310-1,1 through 310-i, j that incorporate features of the present invention and may, for example, be part of an integrated circuit. For an n-channel array of ROM memory cells, shown in FIG. 3, a negative gate voltage and backgate bias is applied to cell transistors 310 in the off state by setting the source voltage of cell transistors (Vs) to a small positive potential (typically 0.1 to 0.3 volts) above the off-state gate voltage (typically 0 volts). With conventional techniques, the source voltage would equal the off-state gate voltage (0 volts). This raised source potential may be stable, not changing or varying between precharge and evaluation phases, nor between read and standby cycles. Alternately, the source potential may be switched between the raised value and 0 volts. The raised value would be used during the precharge phase and during standby cycles. 0 volts would be used during the evaluation phase. Using 0 volts during the evaluation phase avoids prolonged read access and read cycle times caused by reduced cell transistor saturation current associated with the raised source potential. Using 0 volts during the evaluation phase would therefore allow using a higher source voltage during the precharge phase and standby cycles further reducing cell transistor subthreshold leakage current to extremely small values.

As mentioned above, the back gate bias of n-channel cell transistors may remain equal to the off-state gate voltage (typically 0 volts). Alternatively, as with prior techniques, it may be made equal to the source voltage. The former is preferred and results in lower cell transistor subthreshold leakage current.

For a p-channel array of ROM memory cells, the invention sets the source voltage of cell transistors to a small negative potential (typically 0.1 to 0.3 volts below $V_{DD}$) below the off-state gate voltage (typically $V_{DD}$ volts). With conventional techniques, the source voltage would equal the off-state gate voltage ($V_{DD}$). This lowered source potential may be stable, not changing or varying between precharge and evaluation phases, nor between read and standby cycles. Alternately, the source potential may be switched between the lowered value and $V_{DD}$ volts. The lowered value would be used during the precharge phase and during standby cycles. $V_{DD}$ volts would be used during the evaluation phase. Using $V_{DD}$ volts during the evaluation phase avoids prolonged read access and read cycle times caused by reduced cell transistor saturation current associated with the lowered source potential. Using $V_{DD}$ volts during the evaluation phase would therefore allow using a lower source voltage during the precharge phase and standby cycles further reducing cell transistor subthreshold leakage current to extremely small values.

As mentioned above, the back gate bias of p-channel cell transistors may remain equal to the off-state gate voltage (typically $V_{DD}$). Alternatively, as with prior techniques, it may be made equal to the lowered source voltage. The former is preferred and results in lower cell transistor subthreshold leakage current.

A voltage source is necessary to supply the raised (n-channel array) or lowered (p-channel array) source voltage. Suitable voltage sources, including voltage dividers and voltage regulators, are known by those skilled in the art. The value of the new voltage could be made to automatically track the leakage current of the cell array, where the greater the leakage current, the higher (n-channel) or lower (p-channel) the voltage applied to the source.

Because the raised (n-channel) or lowered (p-channel) source voltage is small (0.1 to 0.3 volts), switching the source voltage between phases, as outlined above, would not cause too large an increase in active power. Sources that are switched to the evaluation phase voltage, 0 volts for n-channel and VDD for p-channel, could be limited to those being read or, more practically, to a subset of cells including those being read. This would substantially eliminate increase in active current due to switching the source voltage.

Figure 4:
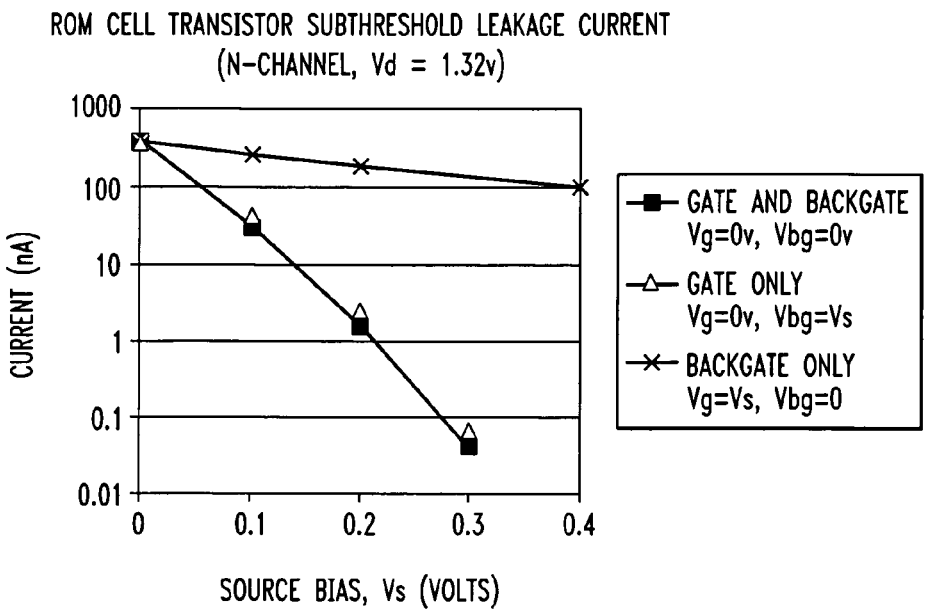
FIG. 4 illustrates the source bias, Vs, versus leakage current for an exemplary n channel transistor.
Figure 5:
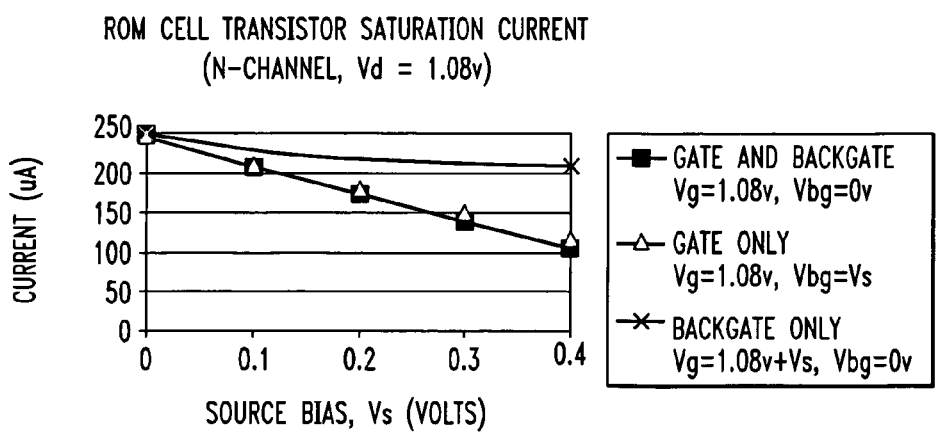
FIG. 5 illustrates the source bias, Vs, versus saturation current for an exemplary n channel transistor.

FIG. 4 illustrates the source bias, Vs, versus leakage current for an exemplary n-channel transistor having a drain voltage of 1.32 volts. As shown in FIG. 4, the n-channel ROM memory array subthreshold leakage current can be reduced one to four orders of magnitude by raising the source voltage (Vs) 0.1 to 0.3 volts above ground while not changing the drain voltage (Vd), gate voltage (Vg) or backgate bias voltage (Vbg). FIG. 5 shows the corresponding reduction in saturation current as an undesirable result of raising the source voltage. Reduced saturation current will reduce column signal development time by a similar percentage. However, column signal development time is only a portion of memory access time, so that read access time and read cycle time will be lengthened by a smaller percentage. By raising the source 0.1 volts above ground, the subthreshold leakage current is reduced by about 90% while reducing saturation current by only about 15%. A typical increase in read access and read cycle times would be about 5% and 3% respectively. As mentioned above this increase can be avoided by switching the source potential between precharge/standby and evaluate phases.

It is to be understood that the embodiments and variations shown and described herein are merely illustrative of the principles of this invention and that various modifications may be implemented by those skilled in the art without departing from the scope and spirit of the invention.

We claim:

1. A method for reducing leakage current in a read only memory array having a plurality of transistors, comprising the step of:
    applying a biased gate voltage, relative to a source voltage, to the gate of each of said plurality of transistors, said biased gate voltage to be applied only during a precharge phase of a read cycle.

2. The method of claim 1, wherein said plurality of transistors are n-channel transistors and wherein said biased voltage is a negative bias voltage relative to said source voltage.

3. The method of claim 2, further comprising the step of applying a negative bias voltage, with respect to the source, to a p-well of said at least one of said plurality of transistors.

4. The method of claim 1, wherein said plurality of transistors are p-channel transistors and wherein said biased voltage is a positive bias voltage relative to said source voltage.

5. The method of claim 4, further comprising the step of applying a positive bias voltage, with respect to the source voltage, to an n-well of said at least one of said plurality of transistors.

6. The method of claim 1, wherein said biased gate voltage is applied during a standby phase.

7. A method for reducing leakage current in an read only memory array having a plurality of transistors, comprising the step of:
    applying a first potential to a drain terminal of each of said plurality of transistors to be programmed;
    applying a second potential to a gate terminal of at least one of said plurality of transistors during a precharge phase;
    applying a third potential to a source terminal of at least one of said plurality of transistors; and
    applying a fourth potential to a well contact of at least one of said plurality of transistors, wherein the third potential is of substantially different value than the second potential.

8. The method of claim 7, wherein the read only memory array is an n-channel memory array.

9. The method of claim 7, wherein the second potential is equal to the fourth potential.

10. The method of claim 8, wherein the third potential is positive, and the second and fourth potential are 0 volts.

11. The method of claim 7, wherein the third potential is between but not equal to the second and first potentials.

12. The method of claim 8, wherein the third potential is approximately 0.1 to 0.3 volts.

13. The method of claim 7, wherein the read only memory array is a p-channel memory array.

14. The method of claim 13, wherein the first potential is approximately zero volts, and the second and fourth potential are a positive voltage.

15. The method of claim 13, wherein the third potential is approximately 0.1 to 0.3 volts lower than said second potential.

16. A read only memory array, comprising:
    a plurality of transistors each having a gate terminal adapted to be substantially simultaneously coupled to a biased gate voltage, relative to a source voltage, said biased gate voltage to be applied only during a precharge phase of a read cycle.

17. The read only memory array of claim 16, wherein said plurality of transistors are n-channel transistors and wherein said biased voltage is a negative bias voltage relative to said source voltage.

18. The read only memory array of claim 17, wherein said read only memory array is further configured to apply a negative bias voltage, with respect to the source, to a p-well of said at least one of said plurality of transistors.

19. The read only memory array of claim 16, wherein said plurality of transistors are p-channel transistors and wherein said biased voltage is a positive bias voltage relative to said source voltage.

20. The read only memory array of claim 19, wherein said read only memory array is further configured to apply a positive bias voltage, with respect to the source voltage, to an n-well of said at least one of said plurality of transistors.

21. The read only memory array of claim 16, wherein said biased gate voltage is applied during a standby phase.

22. A read only memory array, comprising:
 a plurality of transistors, wherein each of said plurality of transistors to be programmed has a drain terminal adapted to be coupled to a first potential and wherein at least one of said transistors further comprises:
 a gate terminal adapted to be coupled to a second potential during a precharge phase;
 a source terminal adapted to be coupled to a third potential; and
 a well contact adapted to be coupled to a fourth potential, wherein the third potential is of substantially different value than the second potential.

23. The read only memory array of claim 22, wherein the read only memory array is an n-channel memory array; the second potential is equal to the fourth potential; the first potential is positive, and the second and fourth potential are 0 volts and the third potential is between but not equal to the second and first potentials.

24. The read only memory array of claim 22, wherein the read only memory array is a p-channel memory array; the first potential is approximately zero volts, and the second and fourth potential are a positive voltage, and the third potential is between but not equal to the second and first potentials.

25. An integrated circuit, comprising:
 a read only memory array, comprising a plurality of transistors each having a gate terminal adapted to be coupled to a biased gate voltage, relative to a source voltage, said biased gate voltage to be applied only during a precharge phase of a read cycle.

26. The integrated circuit of claim 25, wherein said plurality of transistors are n-channel transistors and wherein said biased voltage is a negative bias voltage relative to said source voltage.

27. The integrated circuit of claim 26, wherein said read only memory array is further configured to apply a negative bias voltage, with respect to the source, to a p-well of said at least one of said plurality of transistors.

28. The integrated circuit of claim 25, wherein said plurality of transistors are p-channel transistors and wherein said biased voltage is a positive bias voltage relative to said source voltage.

29. The integrated circuit of claim 28, wherein said read only memory array is further configured to apply a positive bias voltage, with respect to the source voltage, to an n-well of said at least one of said plurality of transistors.

30. The integrated circuit of claim 25, wherein said biased gate voltage is applied during a standby phase.

* * * * *

UNITED STATES PATENT AND TRADEMARK OFFICE
CERTIFICATE OF CORRECTION

| | |
|---|---|
| PATENT NO. | : 7,085,149 B2 |
| APPLICATION NO. | : 10/764000 |
| DATED | : August 1, 2006 |
| INVENTOR(S) | : Dudeck et al. |

It is certified that error appears in the above-identified patent and that said Letters Patent is hereby corrected as shown below:

In column 10, lines 9-10, before "coupled to a biased gate voltage" and after "gate terminal adapted to be" please insert -- substantially simultaneously --.

Signed and Sealed this

Thirty-first Day of October, 2006

JON W. DUDAS
*Director of the United States Patent and Trademark Office*